US006759865B1

(12) United States Patent
Gu et al.

(10) Patent No.: US 6,759,865 B1
(45) Date of Patent: Jul. 6, 2004

(54) ARRAY OF DICE FOR TESTING INTEGRATED CIRCUITS

(75) Inventors: Qi Gu, Fremont, CA (US); Bo Jin, Campbell, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/209,088

(22) Filed: Jul. 30, 2002

(51) Int. Cl.[7] .............................................. G01R 31/26
(52) U.S. Cl. .................................... 324/765; 324/158.1
(58) Field of Search ............................... 324/765, 754, 324/756, 758, 761, 158.1; 439/44, 45, 54, 68, 482

(56) References Cited

U.S. PATENT DOCUMENTS

| 5,061,033 | A | 10/1991 | Richard |
| 5,477,160 | A | 12/1995 | Love |
| 5,807,767 | A | 9/1998 | Stroupe |
| 5,929,651 | A | * 7/1999 | Leas et al. ................... 324/765 |
| 6,075,373 | A | * 6/2000 | Iino ........................... 324/754 |
| 6,084,215 | A | 7/2000 | Furuya et al. |
| 6,400,173 | B1 | * 6/2002 | Shimizu et al. ............. 324/765 |
| 6,452,411 | B1 | * 9/2002 | Miller et al. ................ 324/765 |
| 6,483,330 | B1 | * 11/2002 | Kline .......................... 324/754 |
| 6,527,563 | B2 | 3/2003 | Clayton |
| 6,531,335 | B1 | 3/2003 | Grigg |
| 6,551,844 | B1 | 4/2003 | Eldridge et al. |
| 6,559,666 | B2 | 5/2003 | Bernier et al. |

\* cited by examiner

*Primary Examiner*—David A. Zarneke
*Assistant Examiner*—Tung X. Nguyen
(74) *Attorney, Agent, or Firm*—Okamoto & Benedicto LLP

(57) ABSTRACT

In one embodiment, a test interface for testing integrated circuits includes an array of dice. A removable electrical connection (e.g., an interposer) may be coupled between the array of dice and a wafer containing multiple dice to be tested. The removable electrical connection allows electrical signals to be transmitted between the array of dice and the wafer. The test interface may be used in conjunction with a tester.

8 Claims, 7 Drawing Sheets

ARRAY OF DICE FOR TESTING INTEGRATED CIRCUITS

CROSS-REFERENCE TO RELATED APPLICATION

This application is related to the following commonly-owned disclosure, which is incorporated herein by reference in its entirety: U.S. application Ser. No. 10/144,676, entitled "PROBE CARD FOR TESTING INTEGRATED CIRCUITS", filed by James Nulty, Brenor Brophy, Tom McCleary, Bo Jin, Qi Gu, Thurman J. Rodgers, and John O. Torode on May 13, 2002.

BACKGROUND OF THE INVENTION

1. Field of the Invention

The present invention relates generally to integrated circuits, and more particularly to methods and apparatus for testing integrated circuits.

2. Description of the Background Art

A test equipment unit for testing integrated circuits in die form is commonly referred to as a "tester". A typical tester can be coupled to a probe card, which includes probes for contacting pads of a die being tested. The probe card allows the tester to send and receive test related signals to and from the die.

The cost of testing a die is affected by the throughput of the tester. Generally speaking, throughput is a measure of how many dice can be tested within a period of time. The higher the throughput, the lower the cost of testing. Thus, methods and apparatus for testing multiple dice at the same time are generally desirable.

SUMMARY

In one embodiment, a test interface for testing integrated circuits includes an array of dice. A removable electrical connection (e.g., an interposer) may be coupled between the array of dice and a wafer containing multiple dice to be tested. The removable electrical connection allows electrical signals to be transmitted between the array of dice and the wafer. The test interface may be used in conjunction with a tester.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
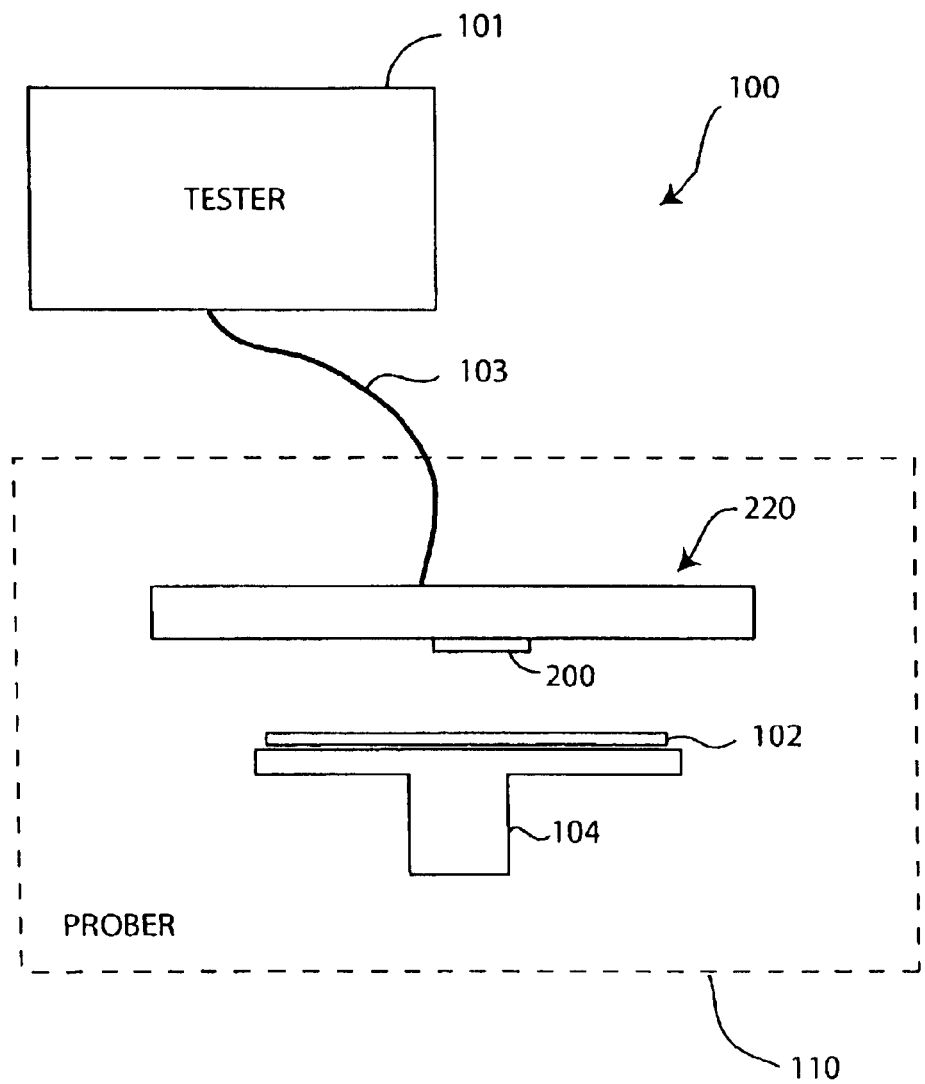
FIG. 1 schematically shows a test environment in accordance with an embodiment of the present invention.

FIG. 1 shows a schematic diagram of a test environment 100 in accordance with an embodiment of the present invention. Test environment 100 may include a tester 101 and a prober 110. Tester 101 may be a commercially available test equipment product such as those of the type available from Advantest Corporation, for example. Prober 110 may house a probe card 220, a chuck 104, and devices under test, which in this example are dice on a wafer 102. Dice on wafer 102 are also referred to as "test dice". Chuck 104 supports wafer 102 during testing.

Probe card 220 includes a test interface 200. Test interface 200 may be a semiconductor substrate. In one embodiment, test interface 200 includes one or more dice referred to as "probe dice". Test interface 200 may include removable electrical connections to corresponding contact points (e.g., bumps, pads) on test dice on wafer 102. The removable electrical connections may be attached to contact points on probe dice on test interface 200. Removable electrical connections may include cantilever probes, spring probes, pogo probes. interposers, and other means for making an electrical connection. During a test run, the removable electrical connections touch contact points on a test die. The removable electrical connections are removed away from the test die after the test is over. The removable electrical connections allow tester 101 to send test-related signals (e.g., stimulus signals) to wafer 102 over a path including a link 103, probe card 220, and test interface 200. Similarly, tester 101 may receive test-related signals (e.g., response signals) from wafer 102 over the same path.

Figure 2A:
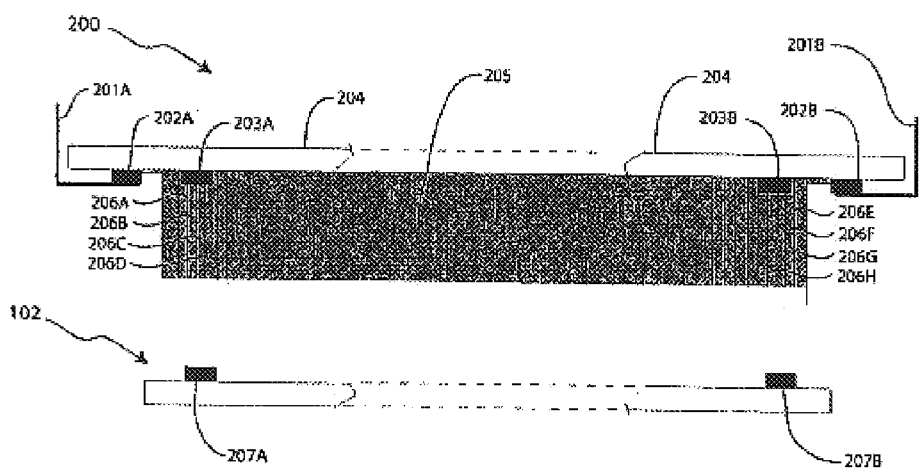
FIGS. 2A and 2B schematically show a test interface in accordance with an embodiment of the present invention.

FIG. 2A shows a schematic diagram of a test interface 200 in accordance with an embodiment of the present invention. In FIG. 2A, test interface 200 is shown along with a wafer 102. Test interface 200 may be used in a variety of probe cards. For example, test interface 200 may be used in a probe card of the type disclosed in commonly-owned U.S. application Ser. No. 10/144,676, entitled "PROBE CARD FOR TESTING INTEGRATED CIRCUITS", filed by James Nulty, Brenor Brophy, Tom McCleary, Bo Jin, Qi Gu, Thurman J. Rodgers, and John O. Torode on May 13, 2002. The just mentioned disclosure is incorporated herein by reference in its entirety. Test interface 200 may also be used in conventional probe cards. A backside 204 of test interface 200 may be attached to a probe card using a variety of attachment means. For example, backside 204 may be attached to a probe card by epoxy bonding.

As will be described below, test interface 200 may comprise an array of dice cut from a semiconductor wafer. The dice of test interface 200, referred to as "probe dice", are on the side of test interface 200 opposite backside 204. A probe die may include one or more probe die pads 203 (i.e., 203A, 203B, . . . ). A probe die pad may be electrically coupled to a bond pad 202 (i.e., 202A, 202B, . . . ), which may be electrically coupled to a cable 201 (i.e., 201A, 201B, . . . ), which in turn may be electrically coupled to a tester 101. For example, a cable 201 may be electrically coupled to or be a part of a link 103 that is electrically coupled to a tester 101 (see FIG. 1). A cable 201 may have one or more conductive wires electrically coupled to bond pads 202.

In the example of FIG. 2A, an interposer 205 serves as a removable electrical connection between test interface 200 and wafer 102. Interposer 205 may be a conductive elastomeric interposer, such as the type available from Shin-Etsu Polymer Co. Ltd., of Japan under the product name "MT-type Inter-connector™" interconnect material. Interposer 205 may be attached to test interface 200 using a high temperature adhesive, for example. Instead of permanently attaching interposer 205 to test interface 200, interposer 205 may also be manually inserted between test interface 200 and wafer 102 before a test run.

Figure 2B:
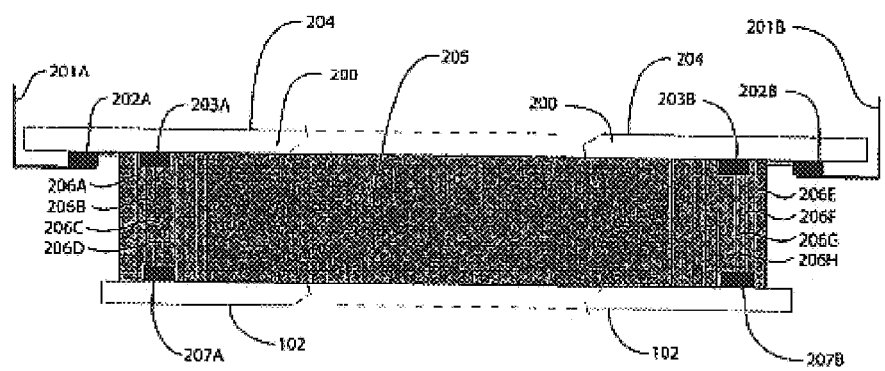

Interposer 205 includes a plurality of vertically oriented conductive wires denoted as wires 206 (i.e., 206A, 206B, . . . ). Note that only some of wires 206 are labeled in FIG. 2A for clarity of illustration. When pressed against wafer 102 as shown in FIG. 2B, interposer 205 electrically connects probe die pads 203 to corresponding die pads on wafer 102 referred to as "test die pads 207" (i.e., 207A, 207B, . . . ). In the example of FIG. 2B, wires 206A, 206B, and 206C electrically connect probe die pad 203A to test die pad 207A, while wires 206F, 206G, and 206H electrically connect probe die pad 203B to test die pad 207B. A test die pad 207 may be a pad on a die on wafer 102 (not shown), referred to as a "test die". A test die pad 207 may be electrically coupled to circuitry (not shown) in a test die. Wafer 102 may include one or more test dice.

To ensure a reliable electrical connection between a probe die pad 203 and a test die pad 207, a bump (not shown) may be formed on a test die pad 207. The bump may protrude slightly above a passivation layer of wafer 102. For example, with a passivation layer that is about 1 micron high, a bump on a test die pad 207 may be an electroless nickel/gold bump that is about 3 microns high.

Interposer 205 may be compressible (e.g., about 3 mils to 5 mils thick) to make up for imperfections in the planarity of test interface 200 and wafer 102. In other words, interposer 205 may compress to make an electrical connection between test interface 200 and wafer 102 even though one or both of them may not be perfectly flat.

The use of an interposer as a removable connection helps minimize probing damage to test die pads. Unlike probes typically employed in commercially available probe cards, an interposer does not have sharp, pointy surfaces to scratch contact points on a wafer, such as test die pads. Additionally, an interposer makes an electrical connection by compressing in the vertical direction. In contrast, a typical probe, such as a cantilever probe, applies both vertically and horizontally directed force on a contact point on a wafer, increasing the chances of damaging the contact point.

Figure 3A:
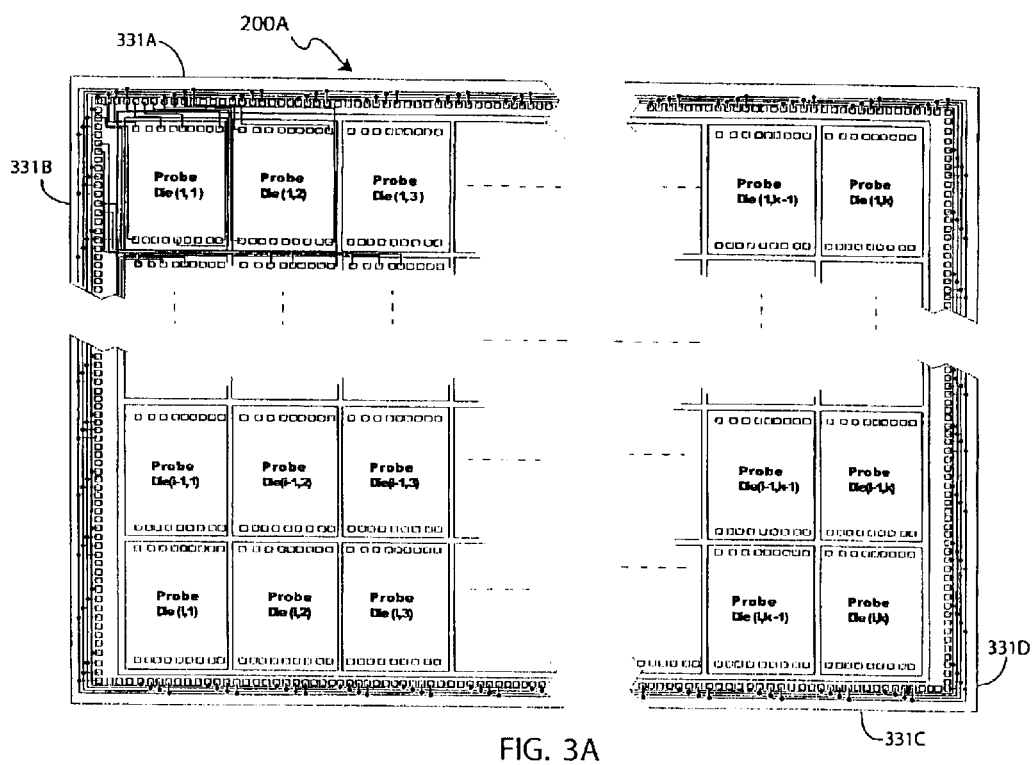
FIG. 3A shows a test interface in accordance with an embodiment of the present invention.

Referring now to FIG. 3A, there is shown a schematic diagram of a test interface 200A in accordance with an embodiment of the present invention. Test interface 200A is a specific embodiment of test interface 200. In one embodiment, test interface 200A comprises a two-dimensional array of dice. In FIG. 3A, each die on test interface 200A is denoted as "probe die(i,k)", with "i" identifying the row location of the probe die and "k" identifying the column location of the probe die. For example, probe die(1,2) is a probe die in the first row, second column of test interface 200A. In the example of FIG. 3A, test interface 200A has four edges denoted as edges 331A, 331B, 331C, and 331D. Test interface 200A may be cut from a semiconductor wafer.

One advantage of using a probe die is that circuitry (not shown) may be optionally incorporated in the probe die to enhance the capability of the test environment. For example, a probe die(i,k) may be configured to include buffer and driver circuits to condition signals coming from or being transmitted to a test die on a wafer 102. As another example, a probe die(i,k) may include test circuitry to augment the test capability of a tester 101. Note that because a probe die(i,k) may be a die cut from a semiconductor wafer, integrated circuit manufacturing techniques may be employed to incorporate circuitry in a probe die(i,k). In one embodiment, a probe die(i,k) is merely used as a test interface, and accordingly does not incorporate circuitry.

Each probe die(i,k) may have a corresponding test die to be tested. In the example of FIG. 3A, probe die(1,1) has a corresponding test die on a wafer 102, probe die(1,2) has a corresponding test die on the wafer 102, and so on. A probe die(i,k) may be a mirror-image of its corresponding test die such that when test interface 200A is "touched down" on a wafer 102, probe die pads on the probe die(i,k) are electrically coupled to corresponding test die pads on the test die. By employing an array of probe dice, multiple test dice may be tested per touch down. As can be appreciated, this increases the throughput of a test environment, which in turn lowers testing cost.

Figure 3B:
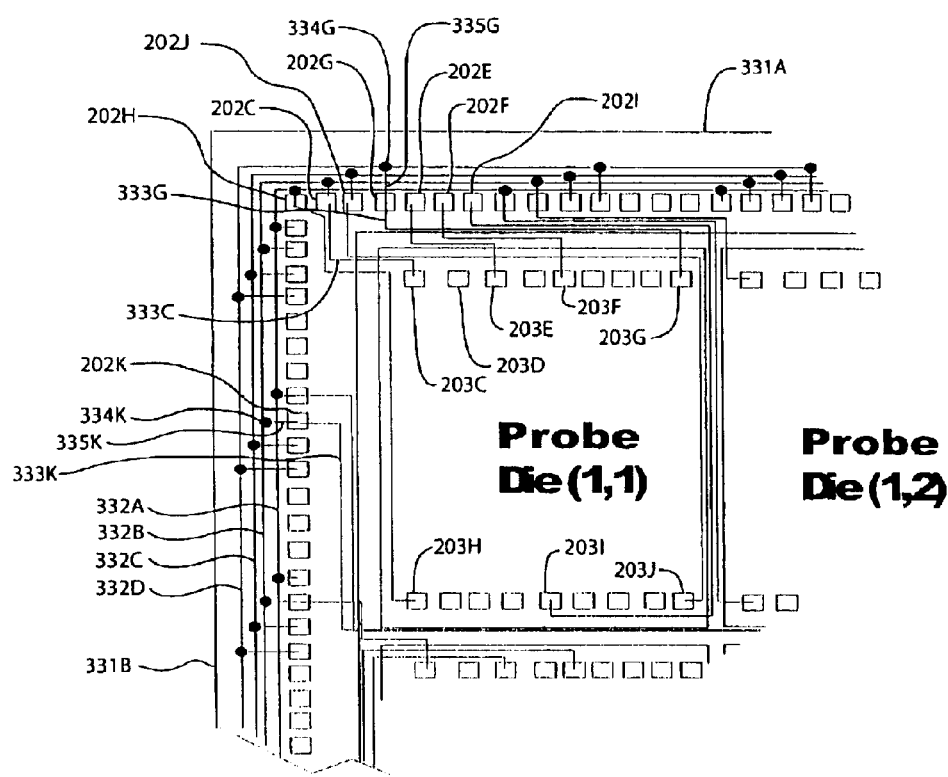
FIG. 3B shows a magnified view of the test interface of FIG. 3A.

FIG. 3B shows a magnified view of the upper left hand side of FIG. 3A where probe die(1,1) is located. Note that only some components of test interface 200A are labeled in FIG. 3B for clarity of illustration. In one embodiment, test interface 200A includes a bus along edges 331. The bus includes one or more bus lines 332 (i.e., 332A, 332B, . . . ). In one embodiment, bus lines 332 are laid out along the edges of test interface 200A to provide common power supply lines. Bus lines 332 may be electrically coupled to receive power from a tester 101, for example. A bus line 332 may be electrically connected to a bond bad 202, which in turn may be electrically connected to a cable that to goes to a tester 101, for example. Bus lines 332 advantageously minimize and simplify electrical connections in test interface 200A.

A probe die(i,k) on test interface 200A may have one or more contact points referred to as "probe die pads 203". A probe die pad 203 may be electrically connected to a bond pad 202 by a conductive line 333 (i.e., 333A, 333B, . . . ). Using probe die(1,1) as an example, conductive line 333C electrically connects probe die pad 203C to bond pad 202C.

A bond pad 202 may be electrically connected to a bus line 332 by a conductive line 335 (i.e., 335A, 335B, . . . ). Bus lines 332 may be on a lower level of test interface 200A. A hole 334 (i.e., 334A, 334B, . . . ), commonly known as a "via", may be provided to electrically connect a conductive line 335 on one level of test interface 200A to a bus line 332 on a lower level. Hole 334 may be filled with an electrically conductive material. Using probe die(1,1) as an example, probe die pad 203G is electrically coupled to bus line 332D over a path including conductive line 333G, bond pad 202G, conductive line 335G, and hole 334G.

Test interface 200A may be employed with test dice that have a built-in-self-test (BIST). A test die with BIST may be tested without having to make an electrical connection to all of its test die pads because a BIST may be activated with a minimum of stimulus signals. Thus, only some of probe die pads 203 may need to be electrically connected to a bond pad 202, which may then be made larger because of more available space. Using probe die(1,1) as an example, probe die pads 203C, 203G, 203H, and 203J may be electrically coupled to bus lines 332B, 332D, 332A, and 332C, respectively, to provide power to a test die corresponding to probe die(1,1). Probe die pads 203I, 203E, and 203F may be used to electrically couple a clock signal, a stream of incoming data signals (data-in), and a stream of outgoing data signals (data-out), respectively, between a test die and a tester 101. Other probe die pads, such as probe die pad 203D, are not used and accordingly not connected to a bond pad.

The aforementioned description of probe die(1,1) equally applies to other probe dice(i,k) on test interface 200A.

Figure 4A:
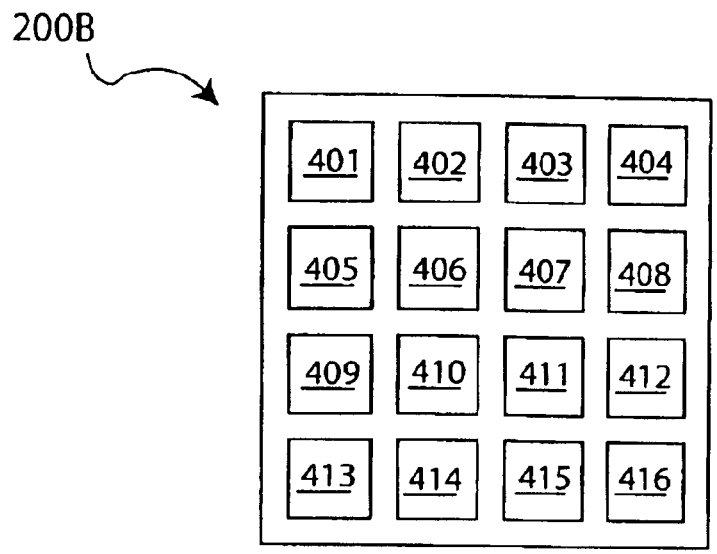
FIGS. 4A–4C schematically illustrate a test interface layout in accordance with an embodiment of the present invention.
Figure 4B:
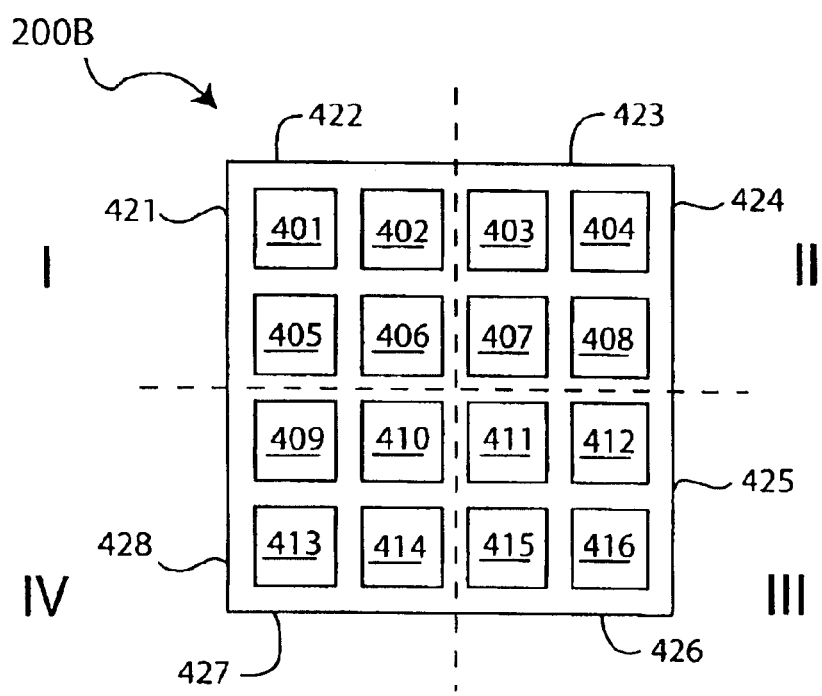
Figure 4C:
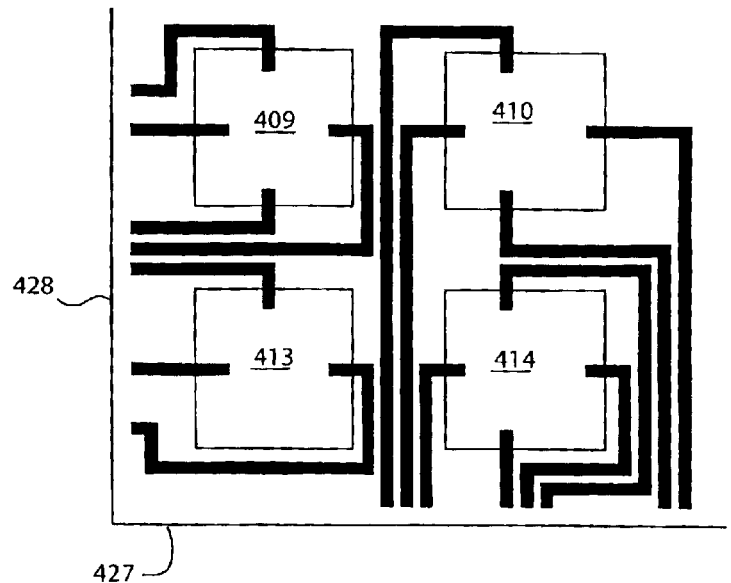

FIGS. 4A–4C schematically illustrate a test interface layout in accordance with an embodiment of the present invention. In the example of FIG. 4A, a test interface 200B comprises a two-dimensional array of dice referred to as "probe dice 401–416". Test interface 200B is a specific embodiment of test interface 200.

To simplify the layout of test interface 200B, probe dice 401–416 may be divided into groups, with each group having approximately the same number of dice. In the example of FIG. 4B, probe dice 401, 402, 405, and 406 belong to group I; probe dice 403, 404, 407, and 408 belong to group II; probe dice 411, 412, 415, and 416 belong to group III; and probe dice 409, 410, 413, and 414 belong to group IV.

Figures 5A, 5B:
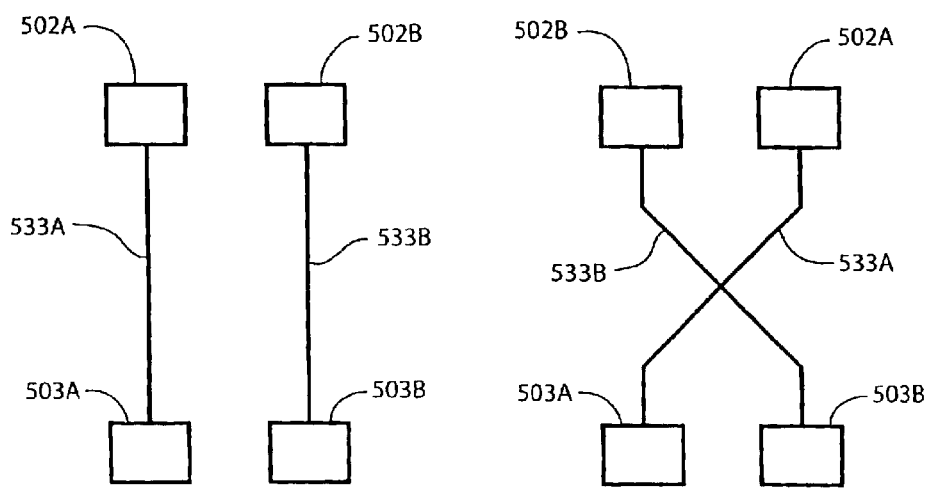
FIGS. 5A and 5B schematically illustrate electrical interconnections between bond pads and a probe die pads.

The electrical connections of probe dice in each group are preferably arranged such that they do not overlap. That is, using FIGS. 5A and 5B as examples, it is more preferable to electrically connect probe die pads 503 (i.e., 503A, 503B) to bond pads 502 (i.e., 502A, 502B) as shown in FIG. 5A than as shown in FIG. 5B. As can be appreciated, crossing electrical connections require more masking steps than side-by-side electrical connections. For example, conductive lines 533A and 533B in FIG. 5A may be deposited using the same mask. In contrast, in FIG. 5B, a first mask is employed to deposit conductive line 533A; thereafter, a second mask is employed to deposit conductive line 533B.

The electrical connections of probe dice in each group are also preferably arranged such that an external cable (e.g., a cable 201) attaches to bond pads on only one edge of the test interface. This allows for a simple, clean cable connection to the test interface.

FIG. 4C shows an electrical connection arrangement in accordance with an embodiment of the present invention. In the example of FIG. 4C, conductive lines from probe dice 409, 410, 413, and 414 are arranged such that they do not overlap to minimize masking steps and, thus, to reduce cost. Also, conductive lines from probe dice 409 and 413 only go to edge 428, while conductive lines from probe dice 410 and 414 only go to edge 427 to simplify cabling. The electrical connection arrangement of probe dice in group IV shown in FIG. 4C may be repeated for probe dice in groups I, II, and III.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A test interface for testing an integrated circuit, the test interface comprising:

an array of probe dice, each probe die in the array of probe dice having an electrical connection to a bus along edges of the test interface; and a removable connection electrically coupling pads of each probe die in the array of probe dice to corresponding contact points on a die under test, wherein the array of probe dice is divided into groups with each group having a same number of probe dice and similar electrical connection arrangements to the bus.

2. The test interface of claim 1 wherein the die under test is on a semiconductor wafer.

3. The test interface of claim 1 wherein the array of probe dice is cut from a semiconductor wafer.

4. The test interface of claim 1 wherein the removable connection comprises an interposer.

5. The test interface of claim 1 wherein the array of probe dice comprises a two-dimensional array of dice.

6. The test interface of claim 1 further comprising:

a cable electrically coupling the test interface to a tester, the cable being connected to only one edge of the test interface.

7. The test interface of claim 1 wherein each die in the array of probe dice has non-overlapping electrical connections to the bus.

8. The test interface of claim 1 wherein each probe die in the array of probe dice includes a built-in-self-test (BIST).

* * * * *